(12) United States Patent
Tsang

(10) Patent No.: US 9,539,483 B1
(45) Date of Patent: Jan. 10, 2017

(54) CLIMBING HOLDS FOR USE IN ROCK CLIMBING AND ROCK CLIMBING SYSTEM

(71) Applicant: Billion Bright (HK) Corporation Limited, Hong Kong (HK)

(72) Inventor: Kei Fung Tsang, Hong Kong (HK)

(73) Assignee: BILLION BRIGHT (HK) CORPORATION LIMITED, Hong Kong (HK)

( * ) Notice: Subject to any disclaimer, the term of this patent is extended or adjusted under 35 U.S.C. 154(b) by 0 days.

(21) Appl. No.: 15/132,223

(22) Filed: Apr. 18, 2016

(30) Foreign Application Priority Data

Jul. 27, 2015 (CN) .......................... 2015 1 0447708
Mar. 10, 2016 (HK) ................................ 16102763.3

(51) Int. Cl.
  *A63B 24/00* (2006.01)
  *A63B 69/00* (2006.01)

(52) U.S. Cl.
  CPC ....... *A63B 69/0048* (2013.01); *A63B 24/0003* (2013.01); *A63B 2220/56* (2013.01)

(58) Field of Classification Search
  CPC combination set(s) only.
  See application file for complete search history.

(56) References Cited

U.S. PATENT DOCUMENTS

| | | | | |
|---|---|---|---|---|
| 8,668,626 | B1* | 3/2014 | Horowitz | A63B 69/0048 482/35 |
| 2005/0243549 | A1* | 11/2005 | Ruston | F21S 2/00 362/233 |
| 2008/0153670 | A1* | 6/2008 | McKirdy | A63B 24/0059 482/1 |
| 2010/0004098 | A1* | 1/2010 | Hensley | A63B 69/0048 482/37 |
| 2011/0063814 | A1* | 3/2011 | Nimura | H05K 9/0067 361/796 |

* cited by examiner

Primary Examiner — Loan H Thanh
Assistant Examiner — Jennifer M Deichl

(57) ABSTRACT

A climbing hold and a rock climbing system for use in rock climbing are disclosed. The climbing hold includes a climbing hold body which is provided with a conductive film and a circuit board. The rock climbing system includes a climbing wall, a main control unit, a control terminal, and a plurality of climbing holds. The main control unit includes a circuit board containing a microcontroller unit (MCU). The climbing hold circuit board and the main circuit board are electrically connected. The control terminal and the main control unit are electrically connected. When the climbing hold is being touched, the conductive film and the static electricity capacity of human body combine to cause a change in electrostatic capacity. The climbing hold circuit board can detect such a change instantaneously and send a status signal to the control terminal. Analysis can be performed by monitoring the status of every climbing hold.

18 Claims, 3 Drawing Sheets

CLIMBING HOLDS FOR USE IN ROCK CLIMBING AND ROCK CLIMBING SYSTEM

CROSS-REFERENCE TO RELATED APPLICATIONS

This application claims the benefit of Chinese Patent Application No. 201510447708.6 filed on Jul. 27, 2015 and Hong Kong Short-term Patent Application No. 16102763.3 filed on Mar. 10, 2016, the contents of which are hereby incorporated by reference.

TECHNICAL FIELD

The present application relates to a rock climbing device, and specifically relates to climbing holds for use in rock climbing and a rock climbing system.

BACKGROUND TECHNOLOGY

Nowadays, apart from natural stones, artificial climbing holds or handholds are widely adopted as climbing holds for use in artificial rock climbing wall or rock climbing system. Climbing holds can be made of various compositions of polymeric materials such as resin, etc. To enhance the attractiveness of climbing and let more youths and children to participate in the climbing activities, fluorescent climbing holds with built-in LEDs, transparent or translucent climbing holds with built-in LEDs have emerged. However, variations that could be made to these climbing holds are very limited. One can only preset illuminating climbing routes of different colors. The only changes are illumination of the entire group, individual illumination and flashing, etc.

SUMMARY

An object of the present application is to provide climbing holds for use in rock climbing and a rock climbing system. The climbing holds for use in rock climbing can perceive the climbing status of a climber and instantly send the status information to a control terminal for analysis and judgment.

According to one aspect, there is provided a climbing hold for use in rock climbing, including a climbing hold body, the climbing hold body being provided with a conductive film. When the climbing hold is being climbed, the conductive film and the static electricity capacity of the human body combine to cause a change in electrostatic capacity. The climbing hold further includes a climbing hold control circuit board, the climbing hold control circuit board being electrically connected with the conductive film.

According to an embodiment of the climbing hold for use in rock climbing, at least one light-emitting diode (LED) is provided inside the climbing hold body, and the LED is electrically connected with the climbing hold control circuit board.

According to an embodiment of the climbing hold for use in rock climbing, the climbing hold may include a plurality of LEDs, and the LEDs may include a full color LED and a white LED.

According to an embodiment of the climbing hold for use in rock climbing, a housing case is provided inside the climbing hold body, and the conductive film is provided between the climbing hold body and the housing case.

According to an embodiment of the climbing hold for use in rock climbing, the climbing hold further includes a conductive film protecting housing case. The conductive film protecting housing case is sleeved around an outer side of the conductive film, and the conductive film protecting housing case is provided between the climbing hold body and the conductive film.

According to an embodiment of the climbing hold for use in rock climbing, a communication interface with electric power supply is provided on the climbing hold control circuit board, and the communication interface is RJ11 or RJ45.

According to an embodiment of the climbing hold for use in rock climbing, a climbing hold microcontroller unit (MCU) is provided on the climbing hold control circuit board, and the climbing hold MCU is electrically connected with the conductive film.

According to an embodiment of the climbing hold for use in rock climbing, the climbing hold control circuit board is located inside the climbing hold or behind a climbing wall.

According to an embodiment of the climbing hold for use in rock climbing, a wireless transmitter and receiver module is provided on the climbing hold control circuit board.

According to an embodiment of the climbing hold for use in rock climbing, the climbing hold further includes a photoelectric sensor for receiving laser emitting from a laser pen in order to set up a climbing route, and the photoelectric sensor is electrically connected with the climbing hold control circuit board.

According to an embodiment of the climbing hold for use in rock climbing, the climbing hold further includes a pressure sensor for obtaining the force when a climber grips the climbing hold and the pressure sensor is electrically connected with the climbing hold control circuit board.

According to another aspect, there is provided a rock climbing system, comprising a climbing wall; a main control unit; a control terminal; and a plurality of climbing holds, wherein the climbing holds are provided on the climbing wall, and the main control unit comprises a main control circuit board, the main control circuit board being provided thereon with a main MCU, and wherein the climbing hold control circuit board of the climbing hold is electrically connected with the main control circuit board, and the control terminal is electrically connected with the main control circuit board.

According to an embodiment of the rock climbing system, the control terminal is a computer terminal or an intelligent terminal.

According to an embodiment of the rock climbing system, the main control unit is provided with a wireless communication module, and the main control unit is connected with the control terminal through the wireless communication module.

According to an embodiment of the rock climbing system, the main control unit is provided with a near field communication module for communication with the intelligent terminal.

The climbing holds for use in rock climbing and the rock climbing system of the present application have the following beneficial effects. The climbing hold of the present application is provided with a conductive film. When the climbing hold is being climbed, the conductive film and the static electricity capacity of the human body combine to cause a change in electrostatic capacity. The climbing hold control circuit board of the climbing hold can instantly detect the change and send the information to a control terminal. In the rock climbing system of the present application, the control terminal can monitor in real time the status of the climbing holds being climbed for statistical analysis.

DESCRIPTION OF THE DRAWINGS

Specific embodiments of the climbing holds for use in rock climbing and the rock climbing system will now be described by way of example with reference to the accompanying drawings wherein.

SPECIFIC EMBODIMENTS

Figure 1:
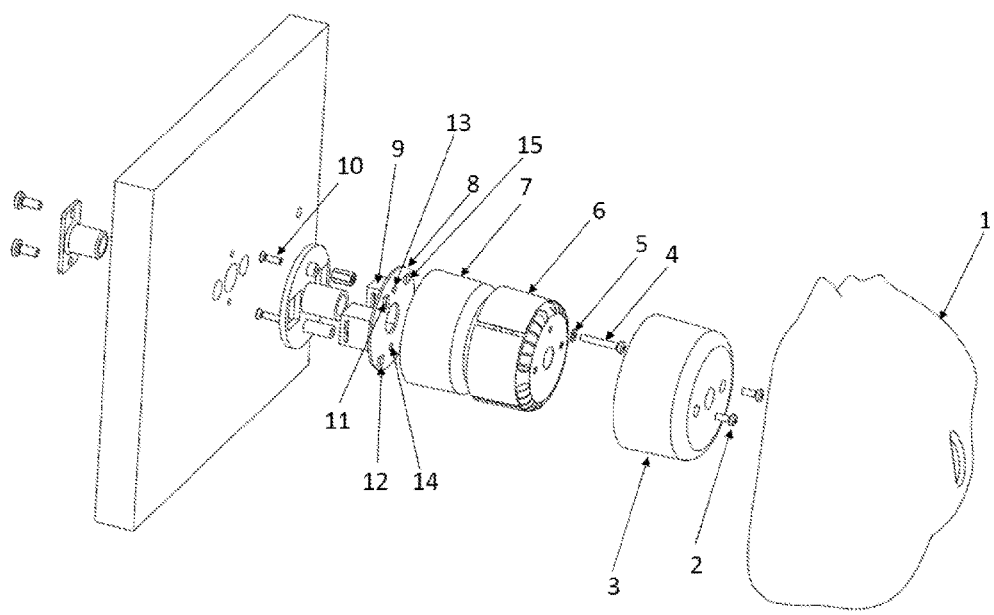
FIG. 1 is an exploded view of an embodiment of the climbing hold for rock climbing of the present application.

To have a clear understanding of the technical features, objects and effects of the climbing holds for use in rock climbing and the rock climbing system of the present application, specific embodiments will now be described in detail with reference to the accompanying drawings.

Embodiments of the climbing holds for use in rock climbing and the rock climbing system of the present application are described below in detail. These embodiments are shown in the accompanying drawings. Like reference numerals representing like parts with like functions are used throughout the drawings.

The climbing hold of the present application involves the addition of a layer of conductive film on the climbing hold body. When the climbing hold is being climbed, the conductive film and the static electricity capacity of the human body combine to cause a change in electrostatic capacity, one would know whether the climbing holds are being in climbing state. A rock climbing state refers to touching, hitting, grasping, gripping, hanging, picking, supporting, pushing or pressing, etc. of the climbing holds. The climbing hold control circuit boards of the climbing holds can send the climbing state instantly to a control terminal for meticulous recording in the control terminal, and then compute, count, analyze the information so as to immediately generate a result. Climbers and/or contestants will be able to make improvement in subsequent exercises and competitions.

The conductive film almost does not occupy any space and is almost weightless. It is not necessary to make any changes to the structure of existing artificial climbing holds. Only a thin conductive film can achieve a monitoring function. Any one spot of the climbing holds can be utilized to a full extent of monitoring so that they can be more conveniently and practically applied on rock climbing.

Transparent conductive films can be selected as the conductive films. Transparent conductive films can be applied on the artificial climbing hold bodies made of fluorescent, transparent and/or translucent materials so as to maintain their light transmittance. The conductive film can be applied on non-conductive climbing holds, including wood, natural stone, and resin, plastic, and rubber climbing holds such that there is no need to change the color or shape of existing artificial climbing holds.

By means of the instant transmission of climbing status from the climbing hold control circuit board during the climbing process, the control terminal can easily record the time required for a climber to climb from one climbing hold to another climbing hold, and can also easily make a record of the climbing route.

In addition, the control terminal can control the climbing holds. The climbing holds can be provided with a plurality of LEDs. Through the control terminal to select the LEDs in the diversified combination of the colors and lighting, which are changing the color, flashing and/or changing color and flashing, etc., to set up a climbing route for the games or the competitions by time and/or rules. It is not only convenient and practical, but also enhances playfulness and flexibility.

FIG. 1 shows an embodiment of a climbing hold or handhold for use in rock climbing of the present application. The climbing hold of the present embodiment includes a climbing hold body 1 which may be made of a polymeric material and may also be made of a natural stone, wood, or other suitable material. The climbing hold body 1 can be provided on a climbing wall 110 and can be used as a climbing support for rock climbing. In order to be able to instantly obtain the climbing status, a conductive film 6 can be provided in the climbing hold body 1. During the rock climbing, the conductive film 6 and the static electricity capacity of a climber combine to cause a change in the electrostatic capacity. The conductive film 6 is preferably a transparent conductive film. In the present embodiment, the climbing hold body 1 can be provided therein with a climbing hold control circuit board 8. The climbing hold control circuit board 8 can be provided thereon with a climbing hold microcontroller unit (MCU) 11. The climbing hold control circuit board 8 and the climbing hold MCU 11 provided thereon can be used for monitoring the electrostatic capacity change of the conductive film 6, hence can send the climbing status to an external equipment. It is understood that the climbing hold MCU 11 is not a necessity. It is not necessary to provide a climbing hold MCU 11 in the climbing hold 1. Instead, a main control unit 210 of the rock climbing system can be used for directly monitoring the electrostatic capacity change of the conductive film 6.

The conductive film 6 can be a transparent conductive film 6, which should be made of polyester, resin mixture and resin mixture of polythiophene and polyethylene terephthalate. The conductive film 6 and the static electricity capacity of the human body combine to cause a change in electrostatic capacity. The conductive film 6 can still combine the static electricity capacity of a human body even they are separated the climbing hold body 1 or other materials. It is understood that the conductive film 6 can be non-transparent or translucent. At present, the touch screen of an intelligent terminal uses such transparent conductive film.

Furthermore, in the present embodiment, in order to allow the climbing holds to be able to serve a guiding function and enhance playfulness of climbing, the climbing hold body 1 may be provided thereon with an LED 14. One or more LEDs 14 may be provided. The LEDs 14 can be white, red, yellow and blue in color, full color, or in any other colors. The LEDs 14 can also be color-changing LEDs. The LEDs 14 and the climbing hold control circuit board 8 can be electrically connected, and can be controlled by the climbing hold MCU 11 based on commands from an external control terminal. The external control terminal can turn on/off the LEDs 14, or change the color, or make the LED 14 flashing with different speed. Moreover, to enhance the interactivity during climbing, the external control terminal can provide feedback when it receives the climbing status on every climbing hold. It could change the color in the climbing hold, etc.

In the present embodiment, in order to protect the conductive film 6, a conductive film protecting housing case 3 (outer housing) and a housing case 7 (inner housing) may be provided inside the climbing hold body 1. The conductive film 6 can be fitted closely between the outer housing 3 and the inner housing 7 such that the shape of the conductive film 6 can be fixed. The climbing hold body 1 is located at an outer portion of the outer housing 3 and the inner housing 7. The conductive film 6 can be connected to the climbing hold control circuit board 8 by a screw 4 and a flat gasket 5. The screw 4 can serve a fixing function, fixing conductive film 6 on the inner housing 7 and also, it could connect the conductive film 6 to the climbing hold control circuit board 8. Furthermore, the outer housing 3 of the present embodiment can be in the form of a cover covering the inner housing 7 and the conductive film 6. The outer housing 3 can serve to protect the conductive film 6. It can prevent the conductive film 6 from being destroyed when rotating the climbing hold body 1. The climbing hold body 1 can cover the outer housing 3. The outer housing 3 can be fixed into the inner housing 7 by screws 2.

In the present embodiment, the climbing hold control circuit board 8 can be fixed on the inner housing 7 by screws 10. The climbing hold control circuit board 8 may be provided with a communication interface 9 with electric power supply to the climbing hold control circuit board 8 as well as communication with the main control unit 210. In the present embodiment, the communications interface 9 can be an RJ11 socket. It is understood that the communications interface 9 can be other suitable standard interface, such as RJ45 interface, etc.

Furthermore, in this embodiment, for easily install the climbing holds, the climbing hold control circuit board 8 can be provided thereon with a wireless transmitter and receiver module 15 for communication between the climbing holds and the main control unit 210 of the rock climbing system. The wireless transmitter and receiver module 15 can be a WiFi module, Bluetooth module, or other suitable wireless transmitter and receiver module.

Furthermore, in this embodiment, in order to more conveniently set up the climbing route, the climbing holds can be further provided with a photoelectric sensor 13 for receiving laser emitting from a laser pen for setting up a rock climbing route. The photoelectric sensor 13 can be electrically connected with the climbing hold control circuit board 8. The photoelectric sensor 13 can be provided at a place where it can be easily irradiated by the laser pen. For example, the photoelectric sensor 13 can be provided on the climbing hold body 1, or it can be provided on the climbing hold control circuit board 8. When the photoelectric sensor 13 is irradiated by the laser pen, a corresponding electrical signal is generated so as to determine whether a climbing hold is selected.

Furthermore, in this embodiment, in order to obtain the rock-gripping force of the climber, the climbing hold can be provided with a pressure sensor 12. After a climber exerts a force on the climbing hold, the productive film 6 can sense the gripping force and time in all position of the climbing hold, and send them to the pressure sensor 12 for analysis. The pressure sensor 12 and the climbing hold control circuit board 8 can be electrically connected. Through the conductive film 6 and the pressure sensor 12, one can monitor and record the climber's climbing status and activity in real time. Detailed climbing data can bring all kinds of climber to have a new climbing experience and improvement.

Figure 2:
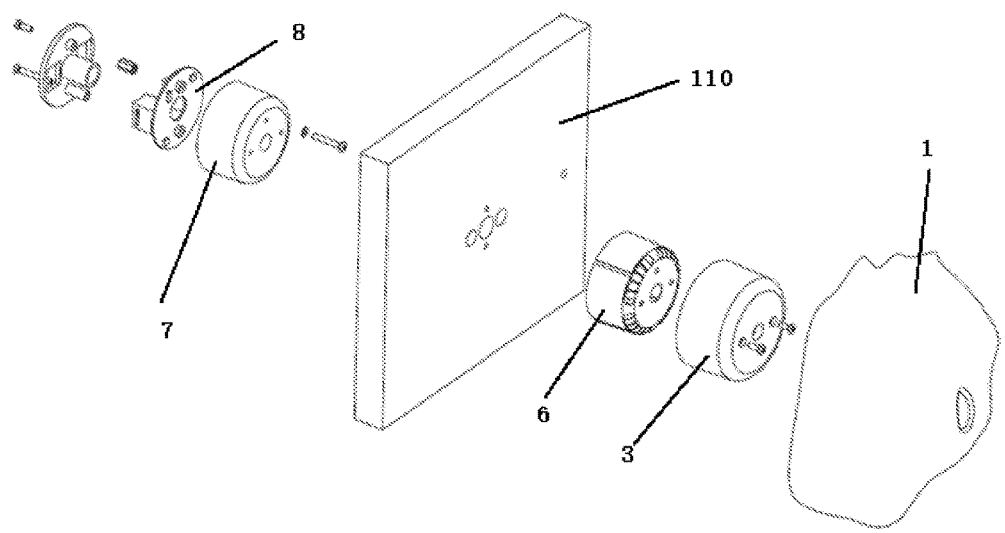
FIG. 2 is an exploded view of another embodiment of the climbing hold for rock climbing of the present application.

FIG. 2 shows another embodiment of the climbing hold of the present application. In the previous embodiment, the climbing hold control circuit board 8 can be disposed within the climbing hold, and the climbing hold is provided on the climbing wall 110. In the present embodiment, the climbing hold control circuit board 8 can be provided behind the climbing wall 110. The climbing hold control circuit board 8 can be connected with the climbing hold body 1 by connecting elements, such as screws or wires, passing through the climbing wall 110. This structure helps to save space in the climbing hold.

Figure 3:
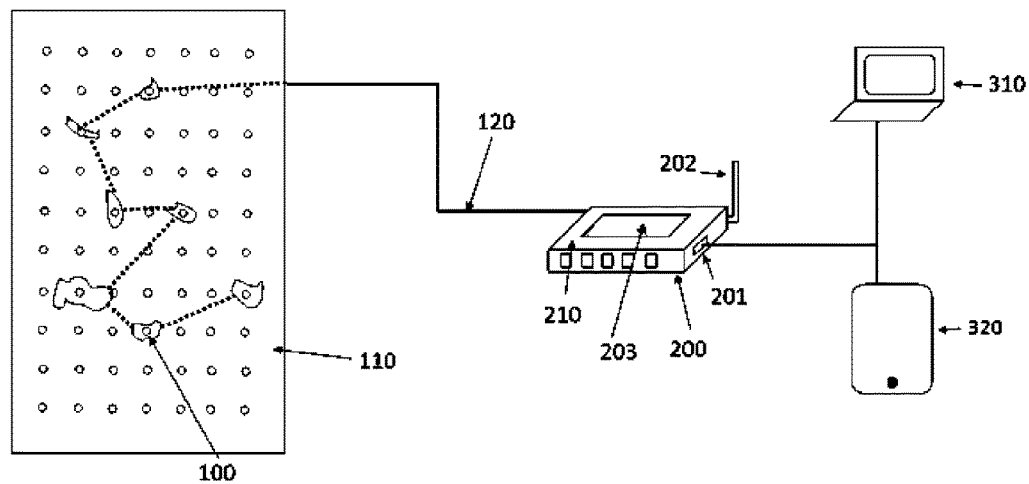
FIG. 3 is an illustrative diagram of the structure of an embodiment of the rock climbing system of the present application.

FIG. 3 shows one embodiment of the rock climbing system of the present application. The rock climbing system includes a climbing wall 110 provided with a plurality of climbing holds 100 for use in rock climbing according to the present application. The climbing holds 100 can be mounted on the climbing wall 110 in various arrangements. The rock climbing system also includes a main control unit 210. The main control unit 210 may include a main control circuit board 200. The main control circuit board 200 can be provided thereon with a main microcontroller unit (MCU), and a USB interface 201 and/or a wireless communication module 202. The climbing hold control circuit board 8 of the climbing hold 100 can be connected with the main control circuit board 200 through a telephone line 120. The rock climbing system also includes a control terminal electrically connected with the main control circuit board 200. The control terminal can be a computer terminal 310 and/or an intelligent terminal 320. The intelligent terminal 320 can be a smart phone, personal digital assistant (PDA), tablet, etc. The control terminal can be connected with the main control circuit board 200 by an electrical cable through the USB interface 201, or by wireless communication through the wireless communication module 202. The main control circuit board 200 can be provided thereon with the USB interface 201 or the wireless communication module 202 only, or it can be provided thereon with both the USB interface 201 and the wireless communication module 202. The main control circuit board 200 can be provided thereon with a near field communication module (NFC module) 203. The near-field communication module 203 can be communicated with a near-field communication module of the intelligent terminal 320. Climbers can check the records of the climbing activities from the intelligent terminal 320. With apps installed in the intelligent terminal, a climber can easily preset climbing routes on the intelligent terminal 320, then put the intelligent terminal 320 on the main control circuit board 200, and the climbing route for that individual climber can be revealed immediately. Of course, it is understood that the main control circuit board 200 can be provided thereon with other types of communication interface.

Figure 4:
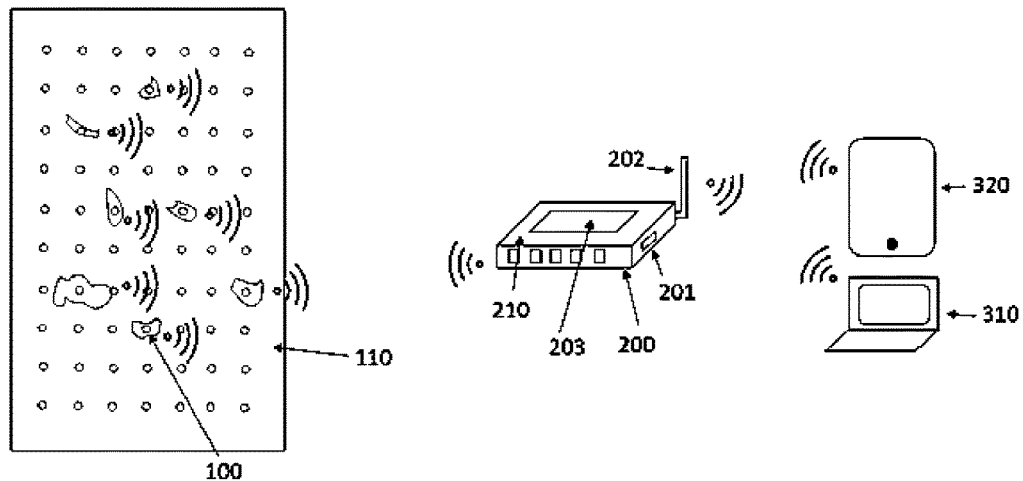
FIG. 4 is an illustrative diagram of the structure of another embodiment of the rock climbing system of the present application.

FIG. 4 shows another embodiment of the rock climbing system of the present application. In this embodiment, apart from using electrical cables to connect climbing holds with the main control circuit board 200 for communication, wireless communicate can also be used for communication. Each climbing hold 100, through its wireless transmitter and receiver module 15, can carry out wireless communication with the main control circuit board 200. When a climbing hold 100 is being touched or released, it can transmit signals from its wireless transmitter and receiver module 15 to the main MCU of the main control circuit board 200. Similarly, the main control unit 210 can also transmit signals to the climbing hold MCU 11 through its wireless communication module 202. In the present embodiment, the communication between the main control unit 210 and the control terminal 310 also can be wireless communication.

In the rock climbing system of the present application, when a climber climbs to a climbing hold, the conductive film 6 of the climbing hold and the static electricity capacity of the human body combine to cause a change in electrostatic capacity. When the electrostatic capacity change is detected by the climbing hold MCU 11 on the climbing hold control circuit board 8, and it is determined that the climber climbs to that climbing hold, then the climbing hold status will be immediately transmitted to the main control unit 210. When the climbing hold MCU 11 detects that the climbing hold is being gripped by a climber over 3 seconds, and it is determined that the climber has gripped the climbing hold, then the rock climbing status is immediately transmitted to the main control unit 210. Of course, it is understood that the gripping time of the climbing hold can be set as needed. When the climber releases the climbing hold, the electrostatic capacity of the conductive film 6 will be returned to normal. After the electrostatic capacity change is detected by the climbing hold MCU 11, it is determined that the climber has released the climbing hold, then the status will be immediately transmitted to the main control unit 210. When the main control unit 210 has received the status of every climbing hold, it will transmit the status of the climbing holds to the control terminal, which may be computer terminal 310 or intelligent terminal 320, through USB. The control terminal can be installed with a corresponding application, which will immediately display the change of status of every climbing hold. Through the application of the rock climbing system in the control terminal and the diversification of the colors and lighting combinations, one can design a different climbing route and game.

Figure 5A:
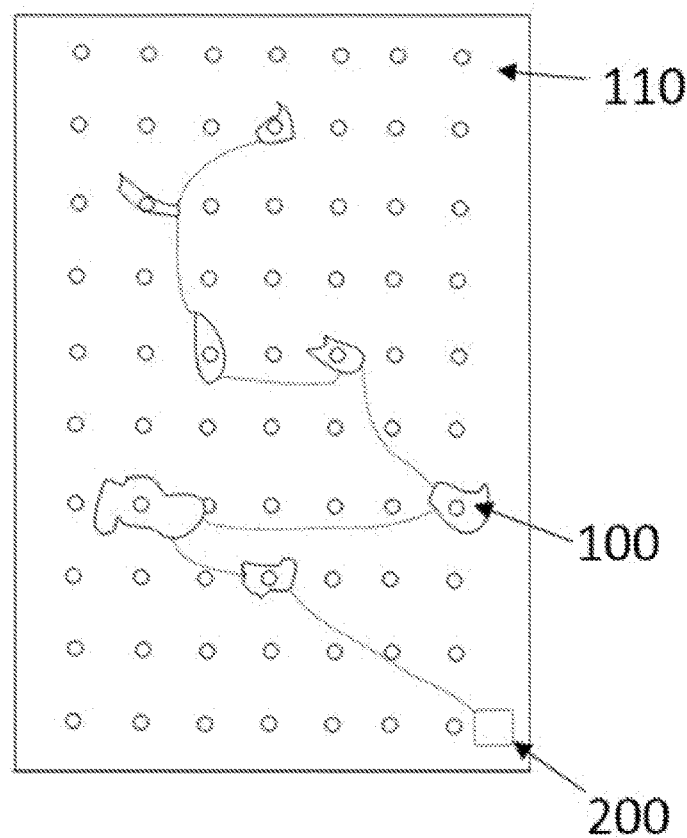
FIG. 5A is an illustrative diagram of the structure of a further embodiment of the rock climbing system of the present application.
Figure 5B:
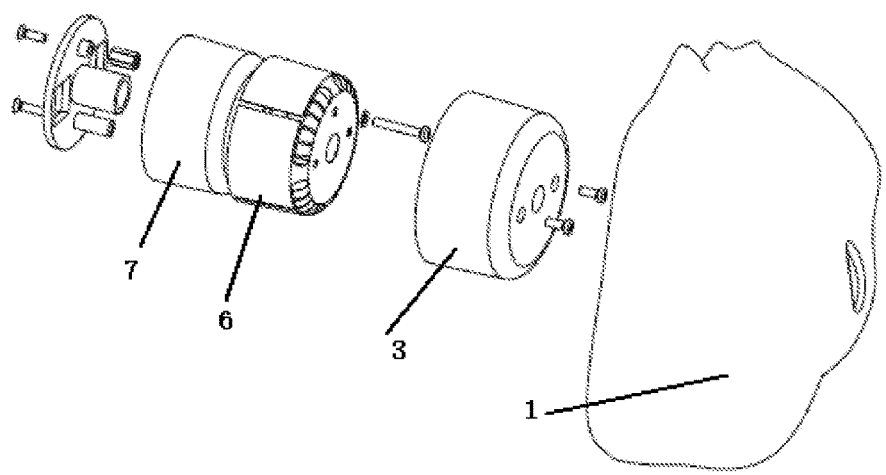
FIG. 5B is an exploded view of the climbing hold of FIG. 5A.

FIG. 5A and FIG. 5B show other embodiments of the rock climbing system and the climbing hold respectively. In the rock climbing system of the present embodiment, climbing hold 100 is no longer provided with a climbing hold MCU 11. The conductive film 6 of the climbing hold 100 and LEDs can be connected directly to the main control circuit board 200 of the main control unit 210. The main MCU of the main control circuit board 200 can directly monitor electrostatic capacity change of the conductive film 6 and control the LEDs.

The climbing hold of the present embodiment is provided with a conductive film. When a climbing hold is being climbed, the electrostatic capacity of the conductive film will be changed. The climbing hold MCU 11 of the climbing hold control circuit board 8 can instantly detect the change and send the information to the control terminal. In the rock climbing system of the present embodiment, the control terminal can monitor in real time the rock climbing status of the climbing holds for statistics and analysis.

The climbing hold of the present embodiment is provided with a conductive film 6 and a control circuit board 8, and can sense pressure in all positions. When a climber exerts a force on the climbing hold, the conductive film 6 can sense the gripping force, and provide the data to the control terminal for statistical analysis. Detailed climbing data can bring all kinds of climber to have a new climbing experience and improvement.

Specific embodiments have been described above with reference to the accompanying drawings. However, the present application is not limited to the above specific embodiments. The above specific embodiments are merely illustrative and should not be considered as limiting. It should be noted that, upon reading the above disclosure, a person skilled in the art can make various other changes or modifications without departing from the scope of the appended claims.

What is claimed is:

1. A climbing hold for use in rock climbing, comprising a climbing hold body, the climbing hold body being provided with a conductive film such that when the climbing hold is being climbed, the conductive film and a human body's static electricity capacity combine to cause a change in electrostatic capacity; and the climbing hold further comprising a climbing hold control circuit board, the climbing hold control circuit board being electrically connected with the conductive film;

wherein a housing case is provided inside the climbing hold body, and the conductive film is provided between the climbing hold body and the housing case; and the climbing hold further comprises a conductive film protecting housing case, the conductive film protecting housing case being sleeved around an outer side of the conductive film, the conductive film protecting housing case being provided between the climbing hold body and the conductive film.

2. The climbing hold for use in rock climbing as claimed in claim 1, wherein at least one light-emitting diode (LED) is provided inside the climbing hold body, and the LED is electrically connected with the climbing hold control circuit board.

3. The climbing hold for use in rock climbing as claimed in claim 2, comprising a plurality of LEDs, the LEDs comprising a full color LED and a white LED.

4. The climbing hold for use in rock climbing as claimed in claim 1, wherein the climbing hold control circuit board is located inside the climbing hold, in front of a climbing wall.

5. The climbing hold for use in rock climbing as claimed in claim 4, wherein the conductive film is fitted closely between the conductive film protecting housing case and the housing case to fix a shape of the conductive film; the conductive film protecting housing case is in the form of a cover covering the housing case and the conductive film; and the conductive film protecting housing case is fixed into the housing case by a first screw.

6. The climbing hold for use in rock climbing as claimed in claim 1, wherein a communication interface with electric power supply is provided on the climbing hold control circuit board, and the communication interface with electric power supply is an RJ11 or RJ45 interface.

7. The climbing hold for use in rock climbing as claimed in claim 1, wherein a climbing hold microcontroller unit (MCU) is provided on the climbing hold control circuit board, and the climbing hold MCU is electrically connected with the conductive film.

8. The climbing hold for use in rock climbing as claimed in claim 1, wherein the climbing hold control circuit board is located behind a climbing wall and the conductive film is connected to the climbing hold control circuit board by a second screw and a flat gasket.

9. The climbing hold for use in rock climbing as claimed in claim 1, wherein a wireless transmitter and receiver module is provided on the climbing hold control circuit board.

10. The climbing hold for use in rock climbing as claimed in claim 1, wherein the climbing hold further comprises a photoelectric sensor for receiving laser emitting from a laser pen so as to set up a rock climbing route, and the photoelectric sensor is electrically connected with the climbing hold control circuit board.

11. The climbing hold for use in rock climbing as claimed in claim 1, wherein the climbing hold further comprises a pressure sensor, and the pressure sensor is electrically connected with the climbing hold control circuit board.

12. A rock climbing system, characterized by a climbing wall; a main control unit; a control terminal; and a plurality of climbing holds each comprising a climbing hold body, the climbing hold body being provided with a conductive film such that when the climbing hold is being climbed, the conductive film and a human body's static electricity capacity combine to cause a change in electrostatic capacity; and each climbing hold further comprising a climbing hold control circuit board, the climbing hold control circuit board being electrically connected with the conductive film; wherein the climbing holds are provided on the climbing wall, and the main control unit comprises a main control circuit board, the main control circuit board being provided thereon with a main microcontroller unit (MCU), and wherein the climbing hold control circuit board of the climbing hold is electrically connected with the main control circuit board, and the control terminal is electrically connected with the main control circuit board;

wherein a housing case is provided inside the climbing hold body, and the conductive film is provided between the climbing hold body and the housing case; and the climbing hold further comprises a conductive film protecting housing case, the conductive film protecting housing case being sleeved around an outer side of the conductive film, the conductive film protecting housing case being provided between the climbing hold body and the conductive film.

13. The rock climbing system as claimed in claim 12, wherein the control terminal is a computer terminal or an intelligent terminal.

14. The rock climbing system as claimed in claim 12, wherein the main control unit is provided with a wireless communication module, and the main control unit is connected with the control terminal through the wireless communication module.

15. The rock climbing system as claimed in claim 12, wherein the main control unit is provided with a near field communication module for communication with an intelligent terminal.

16. The rock climbing system as claimed in claim 12, wherein the climbing hold comprises a plurality of LEDs, and the plurality of LEDs comprises a full color LED and a white LED.

17. The rock climbing system as claimed in claim 12, wherein the climbing hold further comprises a photoelectric sensor for receiving laser emitting from a laser pen so as to set up a rock climbing route, and the photoelectric sensor is electrically connected with the climbing hold control circuit board.

18. The rock climbing system as claimed in claim 12, wherein the climbing hold further comprises a pressure sensor, and the pressure sensor is electrically connected with the climbing hold control circuit board.

* * * * *